(12) United States Patent
Sze et al.

(10) Patent No.: US 6,291,338 B1
(45) Date of Patent: Sep. 18, 2001

(54) METHOD OF FABRICATING SELF-ALIGNED POLYSILICON VIA PLUG

(75) Inventors: Jhy-Jyi Sze, Tainan; Benjamin Szu-Min Lin, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/605,089

(22) Filed: Jun. 26, 2000

(51) Int. Cl.$^7$ ................................................. H01L 21/4763
(52) U.S. Cl. ............................................ 438/629; 438/398
(58) Field of Search ..................................... 438/398, 254, 438/255, 629, 576, 618, 622, 627, 638, 640, 595, 597

(56) References Cited

U.S. PATENT DOCUMENTS 5,879,986 * 3/1999 Sung ...................................... 438/253

* cited by examiner

Primary Examiner—David Nelms
Assistant Examiner—David Vu
(74) Attorney, Agent, or Firm—Jiawei Huang; J. C. Patents

(57) ABSTRACT

A method of fabricating a via plug for self-aligned interconnects is provided. The method features initially forming a polysilicon buffer layer and a silicon oxide layer in sequence on an inter-polysilicon dielectric (IPD) layer, followed by forming a trench opening in the silicon oxide layer. The trench opening is then filled with a metal line. A patterned photoresist layer is formed on the silicon oxide layer to form a photoresist opening which exposes a part of the metal line. The exposed part of the metal line and a part of the polysilicon buffer layer are removed to expose a part of the IPD layer, followed by removing the photoresist layer and the silicon oxide layer. With the polysilicon buffer layer and the metal line serving as a mask, the exposed part of the IPD layer is removed to form a via opening. The via opening is then filled with a polysilicon layer which is formed on the polysilicon buffer layer and the metal line. The polysilicon layer, the polysilicon buffer layer, and the metal line are etched until the IPD layer is exposed to form a via plug.

13 Claims, 4 Drawing Sheets

METHOD OF FABRICATING SELF-ALIGNED POLYSILICON VIA PLUG

BACKGROUND OF THE INVENTION

1. Field of Invention

The present invention relates to a fabrication method for a via plug. More particularly, the invention relates to a method of fabricating a self-aligned polysilicon via plug.

2. Description of Related Art

As the semiconductor technology progresses, the device keeps downsizing for entry into the deep micron process. While the integration of the device increases, it becomes less possible to provide sufficient area for fabricating required interconnects. In order to satisfy an increased need for interconnects after the size of the device is minimized, it is desirable to design multilevel interconnects with two or more layers in the very large scale integration (VLSI) technology. Also, it is necessary to form a hole, such as via hole in the insulating layer between two metal layers, and to fill the via hole with a conductive material so as to provide a connection between different metal layers.

As the demand for highly integrated device increases, it implies that the device need to be made more compact, with a smaller metal line and via plug or metal plug. Accordingly, a contact area between the via plug and the metal line becomes smaller. Moreover, in the conventional semiconductor process, the metal layer and the via opening are patterned using a photolithography and etching process. Therefore, once a misalignment occurs during the photolithography and etching process, the contact area between the via plug and the metal line is further reduced. It is known by those skilled in the art that a reduction in contact area between the via plug and the metal line creates a large local current density when the current flows through a junction between the metal line and the via plug. This leads to an electro-migration (EM) which reduces reliability of the device, and even results an open circuit in a worse scenario. The EM occurs as a result of electrons from the current that flowing through the metal line and bombarding a surface of the metal grains to break open connected metal grains. Thus, this leads to an open circuit. As the integration increases, together with a very large misalignment, the open circuit problem becomes more serious while the production yield is greatly reduced.

To better understand the problems caused by downsizing of the device, reference is made to FIGS. 1A through 1C, which illustrate a conventional process for fabricating a DRAM device.

Referring to FIG. 1A, a via opening 110 is formed on a dielectric layer 100.

Referring to FIG. 1B, a conductive layer 120, such as polysilicon layer or polycide layer is formed on the dielectric layer 100 so as to fill the via opening 110 with the conductive layer 120. The method for forming the conductive layer 120 includes chemical vapor deposition (CVD).

Referring to FIG. 1C, the conductive layer 120 is patterned to form a via plug 130, followed by forming a metal line 140 thereon.

The metal line 140 and the via opening 110 are patterned by a photolithography and etching process. Once a misalignment occurs, a contact area between the via plug 130 and the metal line 140 is reduced as shown in FIG. 1C. As the contact area between the via plug and the metal line is reduced, a large local current density is created when the current flows through a junction between the metal line and the via plug. This leads to an electro-migration (EM) which reduces reliability of the device, and even results an open circuit in a worse scenario.

SUMMARY OF THE INVENTION

The invention provides a method of fabricating a self-aligned polysilicon via plug, in order to increase a contact area between the via plug and a metal line even if a misalignment occurs in the conventional process.

According to another aspect of the invention, a fabrication method for the via plug prior to formation of the metal line is provided. The method includes forming the via plug in a self-aligned manner below the metal line, such that a contact area between the via plug and the metal line is equal to an area of the contact opening.

The invention further provides a method of fabricating a self-aligned polysilicon plug in order to provide highly reliable metal interconnects. Therefore, the integration of the device is increased in the deep micron process while a high production yield is maintained.

As embodied and broadly described herein, the invention provides a fabrication method for the polysilicon via plug, which method involves forming a first polysilicon layer on a first silicon layer. A second silicon oxide layer is then formed on the first polysilicon layer, followed by forming a first photoresist layer on the second silicon oxide layer by coating. A first opening is formed on the second silicon oxide layer by patterning the first photoresist layer using a dry etching process prior to removing of the first photoresist layer. The first opening is then filled with a second polysilicon layer. A second photoresist layer is formed on the second silicon oxide layer and the second polysilicon layer. The second photoresist layer is patterned to form a second opening which exposes a part of the second polysilicon layer and a part of the second silicon oxide layer, wherein the second opening is perpendicular to the second polysilicon layer. With the patterned second photoresist layer and the second silicon oxide layer serving as a mask, the exposed part of the second polysilicon layer and a part of the first polysilicon layer are removed to form a third opening which exposes a part of the first silicon oxide layer.

The second photoresist layer and the second silicon oxide layer are removed. With the first polysilicon layer and the second polysilicon layer serving as a mask, the exposed part of the first silicon oxide layer is removed to form a fourth opening. A third polysilicon layer is formed on the first polysilicon layer and the second polysilicon layer so as to fill the via opening. With the first silicon oxide layer serving as an etching stop, an anisotropic etching process is performed to remove the third polysilicon layer, the first polysilicon layer, and the second polysilicon layer until the first silicon oxide layer is exposed. Accordingly, a via plug is formed in the first silicon oxide layer, with a portion of the via plug above the first silicon oxide layer forms a conductive line.

In the method of fabricating the conductive line, the first opening is formed before filling the first opening with the polysilicon layer to form a metal damascene. After the second dielectric layer and the first polysilicon layer are removed, the via opening is formed to reduce an aspect ratio during the formation of the via plug. Thus, the formation of the via plug is greatly improved.

According to the present embodiment, the sequence of steps involved in the conventional process is modified together with a selective etching process for polysilicon/silicon oxide, whereby a opening is formed to expose the IPD layer. Furthermore, a selective etching process for silicon oxide/polysilicon, so that a via opening having its edges parallel to polycide lines is formed. A self-aligned via plug is then formed in the via opening, wherein a portion of the via plug above the first silicon oxide layer forms a part of the conductive line. Therefore, the invention provides a method of fabricating a self-aligned via plug, which improves a contact area between the via plug and the conductive line, even when a misalignment occurs in the conventional fabrication process for increasing the device integration.

In addition, the via plug is formed in a self-aligned manner below the conductive line, while the contact area between the via plug and the conductive line is equal to the area of the via opening, so highly reliable conductive lines are provided. Therefore, the integration of the device is increased in the deep micron process, as well as maintaining a high production yield.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
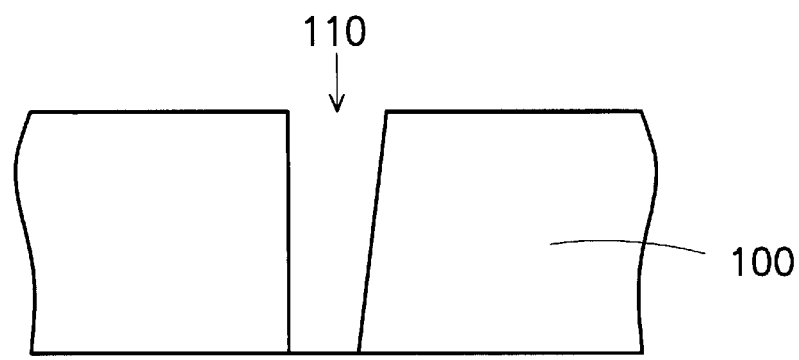
FIGS. 1A through 1C are schematic, cross-sectional diagrams illustrating a conventional process for fabricating a DRAM device.
Figure 1B:
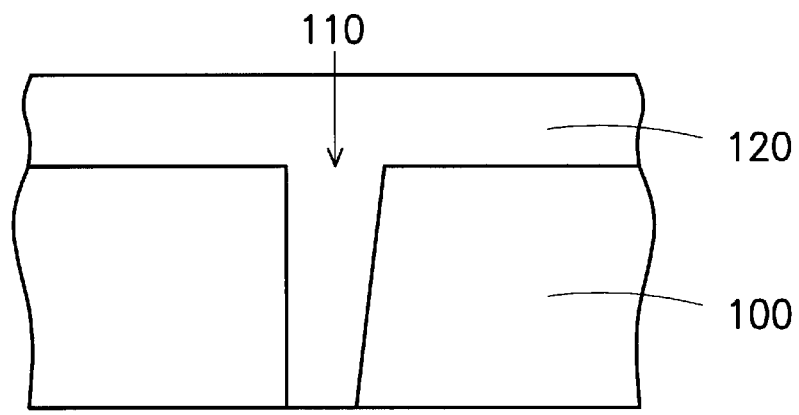
Figure 1C:
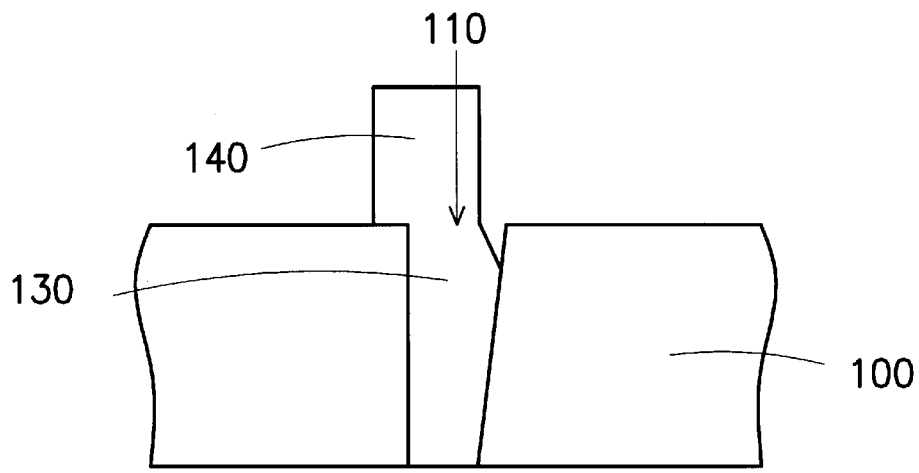
Figure 2:
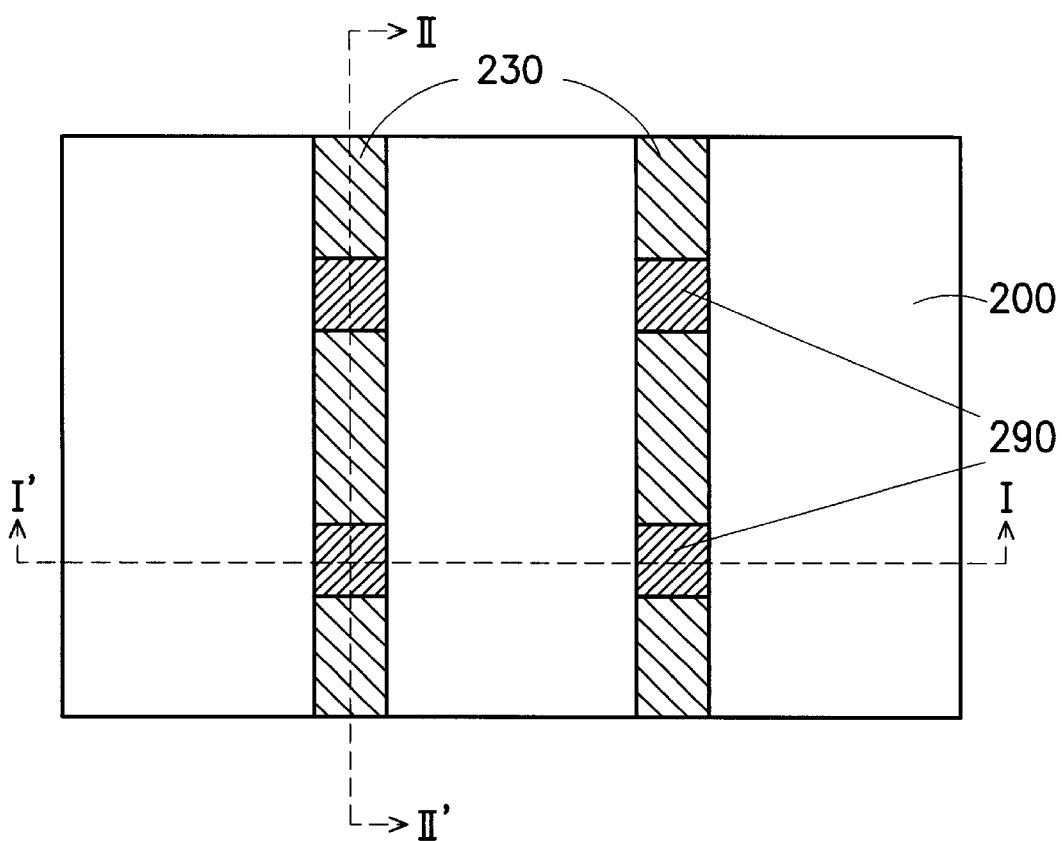
FIG. 2 is top view taken from a resultant structure according to one preferred embodiment of this invention.
Figure 3A:
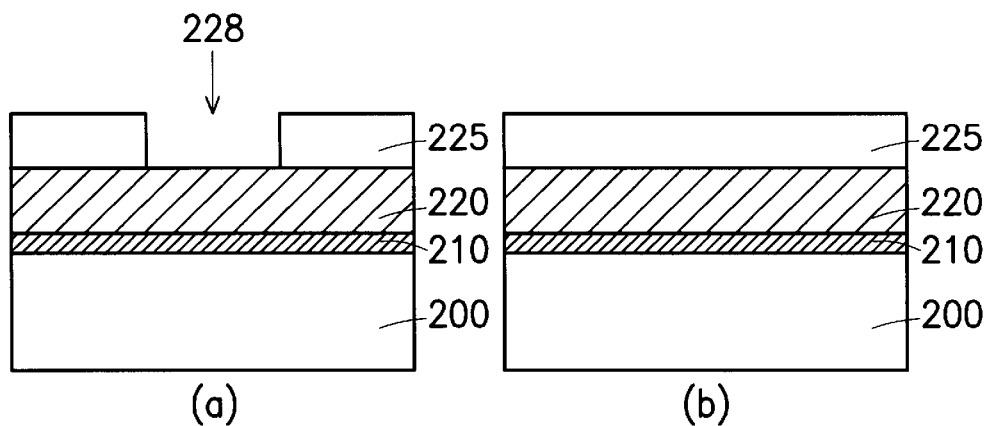
FIGS. 3A through 3F are schematic diagrams taken at different cross-sections to illustrate the method of fabricating polysilicon via for self-aligned interconnects according to one preferred embodiment of this invention. In each diagram, (a) represents cross-sectional view taken from a bisecting line of XX', (b) represents cross-sectional view taken from a bisecting line of YY'.

Referring to both FIG. 3A(a) and 3A(b), an inter-polysilicon dielectric (IPD) layer 200 is provided with a polysilicon buffer layer 210 formed thereon. The IPD layer 200 is made of material such as silicon oxide. The method for forming the polysilicon buffer layer 210 includes chemical vapor deposition (CVD). Another silicon oxide layer 220 is formed on the polysilicon buffer layer 210, while the method for forming the silicon oxide layer 220 preferably includes low pressure chemical vapor deposition (LPCVD). A photoresist layer 225 is formed and patterned on the silicon oxide layer 220, so that a photoresist opening 228 is formed to expose a part of the silicon oxide layer 220.

Figure 3B:
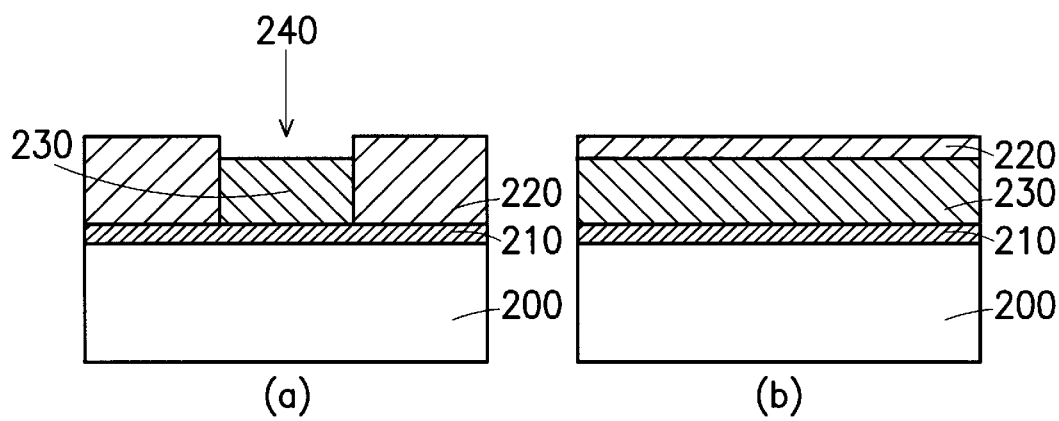

Referring to both FIG. 3B(a) and FIG. 3B(b), a trench opening 240 is formed by dry etching, which removes a part of the silicon oxide layer 220, with the patterned photoresist layer 225 serving as a mask. The patterned photoresist layer 225 is then removed after the formation of the trench opening 240. A doped polysilicon layer (not shown) is formed on the silicon oxide layer 220, so that the trench opening 240 is filled with the doped polysilicon layer. The method for forming doped polysilicon layer includes CVD. Then a portion of the doped polysilicon layer outside the trench opening 240 is removed to form a conductive line 230.

Figure 3C:
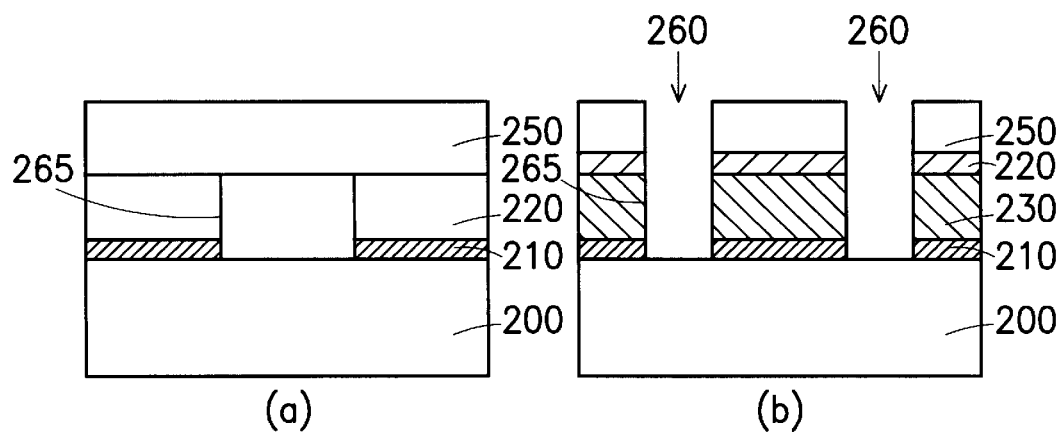

Referring to Both FIG. 3C(a) and FIG. 3C(b), a photoresist layer 250 is formed by coating on the silicon oxide layer 220 and the metal line 230. The photoresist layer 250 is patterned to form a photoresist opening 260 which exposes a part of the conductive line 230 and a part of the silicon oxide layer 220. With the patterned photoresist layer 250 and the silicon oxide layer 220 serving as a mask, a selective etching process is performed to remove the exposed part of the conductive line 230 and a part of the polysilicon buffer layer 210 below thereof. As a result, an opening 265 is formed to expose a part of the IPD layer 200.

Figure 3D:
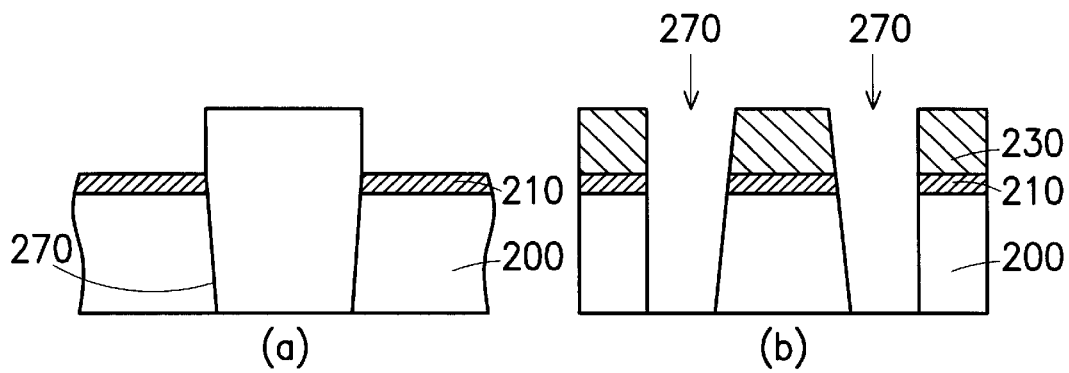

Referring to both FIG. 3D(a) and FIG. 3D(b), the photoresist layer 250 and the silicon oxide layer 220 are removed. The method for removing the silicon oxide layer 220 includes dry etching using a $CF_4$ gas. With the polysilicon buffer layer 210 and the conductive line 230 serving as a mask, the exposed part of the IPD layer 200 is selectively etched to form a via opening 270. The method for forming the via opening 270 includes anisotropic etching process, which etching process selectively removes silicon oxide instead of polysilicon.

Figure 3E:
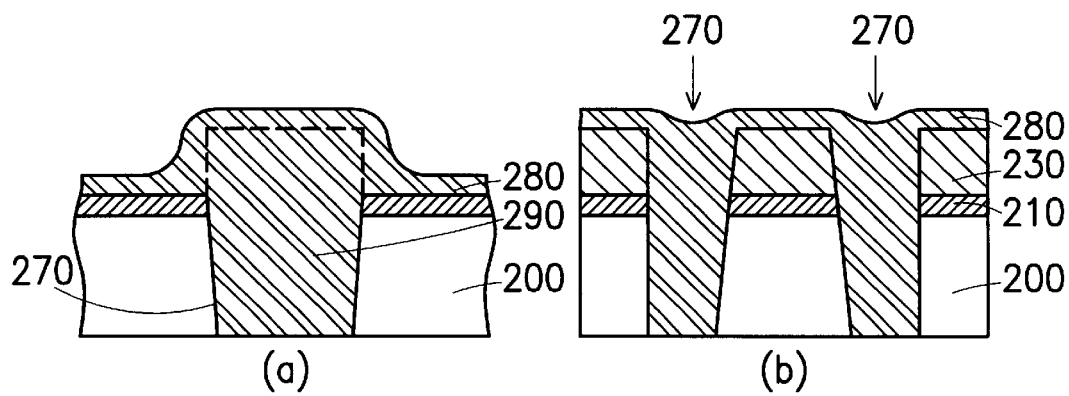

Referring to both FIG. 3E(a) and FIG. 3E(b), a polysilicon layer 280 is formed on the polysilicon buffer layer 210 and the conductive line 230, so that the via opening 270 is filled with the polysilicon layer 280. The method for forming the polysilicon layer 280 includes method, such as CVD.

Figure 3F:
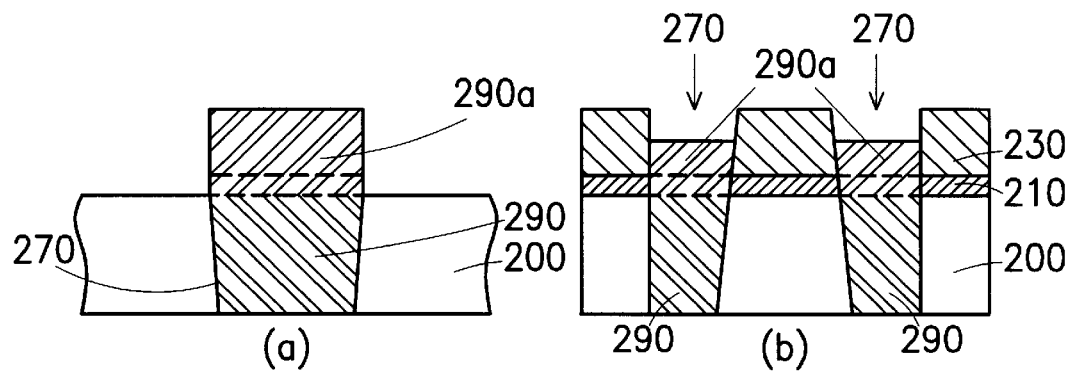

Referring to both FIG. 3F(a) and FIG. 3F(b), the polysilicon layer 280, the polysilicon buffer layer 210, and the conductive line 230 are etched, with the IPD layer 200 serving as an etching stop, until the IPD layer 200 is exposed. As a result, the polysilicon via plug 290 is formed. It is noted from the diagram, a portion of the polysilicon via plug 290 above the IPD layer 200 forms a part of the metal line 230. This is shown as 290a in both FIG. 3F(a) and FIG. 3F(b).

Summarizing the above, it is understood that the sequence of steps involved in the conventional process is modified together with a selective etching process for polysilicon/silicon oxide, whereby a opening is formed to expose the IPD layer. Furthermore, a selective etching process for silicon oxide/polysilicon, so that a via opening having its edges parallel to polycide lines is formed. A self-aligned via plug is thus formed in the via opening, wherein a portion of the via plug above the IPD layer forms a part of the conductive line. Therefore, the invention provides a method of fabricating a self-aligned via plug, which improves a contact area between the via plug and the conductive line, even when a misalignment occurs in the conventional process for increasing the device integration.

In addition, the via plug is formed in a self-aligned manner below the conductive line, while the contact area between the via plug and the conductive line is equal to the area of the via opening, so as to provide highly reliable conductive lines. Therefore, the integration of the device keeps increasing in the deep micron process while a high production yield is maintained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a via plug, comprising:

forming a first polysilicon layer and a silicon oxide layer in sequence on an inter-polysilicon dielectric (IPD) layer;

forming a patterned first photoresist layer on the silicon oxide layer;

removing a part of the silicon oxide layer until the first polysilicon layer is exposed so as to form a first opening in the form of a trench, with the patterned first photoresist serving as a mask;

removing the patterned first photoresist layer;

forming a second polysilicon layer in the first opening;

forming a patterned second photoresist layer on the silicon oxide layer and the second polysilicon layer so as to form a second opening in the patterned second photoresist for exposing a part of the second polysilicon layer and a part of the silicon oxide layer, wherein the second opening is perpendicular to the second polysilicon layer;

removing the exposed part of the second polysilicon layer and a part of the first polysilicon layer, with the patterned second photoresist layer and the silicon oxide layer serving as a mask, so that a third opening is formed through the second polysilicon layer and the first polysilicon layer for exposing a part of the IPD layer;

removing the patterned second photoresist layer and the silicon oxide layer;

after removing the silicon oxide layer, removing the exposed part of the IPD layer for forming a fourth opening, with the first polysilicon layer and the second polysilicon layer serving as a mask;

forming a third polysilicon layer on the first polysilicon layer and the second polysilicon layer, so that the fourth opening is filled with the third polysilicon layer; and removing the third polysilicon layer, the first polysilicon layer, and the second polysilicon layer until the IPD layer is exposed, whereby the via plug is formed.

2. The fabrication method of claim 1, wherein the IPD layer includes a silicon oxide layer.

3. The fabrication method of claim 1, wherein the first polysilicon layer serves as an etching stop in the step of removing a part of the silicon oxide layer.

4. The fabrication method of claim 1, wherein the step of removing a part of the silicon oxide layer includes anisotropic etching.

5. The fabrication method of claim 1, wherein the second polysilicon layer is a doped polysilicon layer.

6. The fabrication method of claim 1, wherein the step of forming a second polysilicon layer in the first opening includes depositing a second polysilicon layer in the first opening by chemical vapor deposition (CVD) followed by removing a part of the second polysilicon layer by chemical mechanical polishing (CMP).

7. The fabrication method of claim 1, wherein the step of forming a second polysilicon layer in the first opening includes a damascene process followed by an etching back process.

8. The fabrication method of claim 1, wherein the step of removing the exposed part of the second polysilicon layer and a part of the first polysilicon layer for forming a third opening includes selective etching for silicon oxide/polysilicon.

9. The fabrication method of claim 1, the step of removing the exposed part of the IPD layer for forming a fourth opening includes selective etching for polysilicon/silicon oxide.

10. The fabrication method of claim 1, wherein the step of removing the third polysilicon layer, the first polysilicon layer, and the second polysilicon layer includes anisotropic etching, with the inter-polysilicon dielectric (IPD) layer serving as an etching stop.

11. A fabrication method for metal interconnects, comprising:

forming a polysilicon buffer layer, and a silicon oxide layer in sequence on an inter-polysilicon dielectric (IPD) layer;

forming a conductive line in the silicon oxide layer;

forming a via opening through the metal line and into the IPD layer;

forming a polysilicon layer on the silicon oxide layer, so that the via opening is filled with the polysilicon layer; and removing the polysilicon layer, the polysilicon buffer layer, and the silicon oxide layer, so that the remaining polysilicon layer forms a polysilicon via plug in the via opening.

12. The fabrication method of claim 11, wherein the conductive line contains doped polysilicon and the step of forming the conductive line includes:

forming a trench in the silicon oxide layer, the trench exposing the polysilicon buffer layer;

depositing a doped polysilicon layer on the silicon oxide layer to fill the trench; and etching back the doped polysilicon layer so that the remaining doped polysilicon layer in the trench forms the conductive line.

13. The fabrication method of claim 11, wherein the step of forming the via plug includes anisotropic etching, with the IPD layer serving as an etching stop.

* * * * *